United States Patent
Nielson

(10) Patent No.: US 12,031,227 B2
(45) Date of Patent: *Jul. 9, 2024

(54) THREE-DIMENSIONAL SEMICONDUCTOR FABRICATION

(71) Applicant: Nielson Scientific, LLC, Lehi, UT (US)

(72) Inventor: Gregory Nolan Nielson, Lehi, UT (US)

(73) Assignee: NIELSON SCIENTIFIC, LLC, Lehi, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/861,244

(22) Filed: Jul. 10, 2022

(65) Prior Publication Data
US 2022/0349084 A1    Nov. 3, 2022

Related U.S. Application Data

(63) Continuation of application No. 16/498,960, filed as application No. PCT/US2018/025428 on Mar. 30, 2018, now Pat. No. 11,421,338.

(60) Provisional application No. 62/618,205, filed on Jan. 17, 2018, provisional application No. 62/480,259, filed on Mar. 31, 2017.

(51) Int. Cl.
| | | |
|---|---|---|
| C25F 3/12 | (2006.01) |
| B81C 1/00 | (2006.01) |
| C25F 7/00 | (2006.01) |
| H01L 21/268 | (2006.01) |
| H01L 21/3063 | (2006.01) |
| H01L 21/67 | (2006.01) |
| H01L 29/16 | (2006.01) |

(52) U.S. Cl.
CPC ............ *C25F 3/12* (2013.01); *B81C 1/00539* (2013.01); *C25F 7/00* (2013.01); *H01L 21/268* (2013.01); *H01L 21/3063* (2013.01); *H01L 21/67086* (2013.01); *H01L 29/1608* (2013.01)

(58) Field of Classification Search
CPC .......... C23F 3/12; C23F 7/00; B81C 1/00539; H01L 21/3063; H01L 21/30604
See application file for complete search history.

(56) References Cited

U.S. PATENT DOCUMENTS

| | | |
|---|---|---|
| 4,838,987 A | 6/1989 | Dobson |
| 5,081,002 A | 1/1992 | Ruberto et al. |
| 5,338,416 A * | 8/1994 | Mlcak .................. C25F 3/12 438/746 |

(Continued)

FOREIGN PATENT DOCUMENTS

| | | | |
|---|---|---|---|
| DE | 3608604 A1 * | 9/1987 | ................ C25F 3/12 |
| JP | H08-221109 | 8/1996 | |

(Continued)

OTHER PUBLICATIONS

WO 2017138625 A1—translation (Year: 2017).*

(Continued)

*Primary Examiner* — Nicholas A Smith
(74) *Attorney, Agent, or Firm* — Calfee, Halter & Griswold LLP

(57) ABSTRACT

Various technologies are described herein pertaining to electrochemical etching of a semiconductor controlled by way of a laser that emits light with an energy below a bandgap energy of the semiconductor.

20 Claims, 10 Drawing Sheets

(56) References Cited

U.S. PATENT DOCUMENTS

| | | | |
|---|---|---|---|
| 5,348,627 | A | 9/1994 | Propst et al. |
| 5,804,090 | A | 9/1998 | Iwasaki et al. |
| 6,790,340 | B1 * | 9/2004 | Izuo .......................... C25F 3/12 |
| | | | 257/E21.216 |
| 11,421,338 | B2 * | 8/2022 | Nielson ..................... C25F 7/00 |
| 2008/0087629 | A1 | 4/2008 | Shimomura et al. |
| 2012/0135606 | A1 | 5/2012 | Shimoi et al. |
| 2021/0104410 | A1 | 4/2021 | Nielson |

FOREIGN PATENT DOCUMENTS

| | | |
|---|---|---|
| JP | 2000-562943 | 7/1999 |
| JP | 2002-026491 | 1/2002 |
| KR | 10-2002-0027504 | 4/2002 |
| KR | 10-2013-0088148 | 8/2013 |
| SG | 11201908799 R | 11/2021 |
| WO | 0007231 A1 | 2/2000 |
| WO | 0191770 A1 | 11/2001 |
| WO | 2016135656 A1 | 9/2016 |
| WO | WO-2017138625 A1 * | 8/2017 ........... B23K 26/064 |

OTHER PUBLICATIONS

Kolasinski et al. "Laser assisted and wet chemical etching of silicon nanostructures," J. Vac. Sci. Technol. A 24(4), 2006 pp. 1474-1479. (Year: 2006).*

Ouyang et al., "Photochemical etching of silicon by two photon absorption," Phys. Stat. Sol. (A) 204, No. 5, 1255-1259 (2007) (Year: 2007).*

DE 3608604 A1—translation (Year: 1987).*

"International Search Report for PCT Patent Application No. PCT/US18/25428", Mailed Date: Jun. 22, 2018, 2 pages.

"Written Opinion of the International Searching Authority for PCT Patent Application No. PCT/US18/25428", Mailed Date: Jun. 22, 2018, 6 pages.

"European Search Report for European Application No. 18776879.1", Mailed Date: Dec. 15, 2020, 11 Pages.

Luong, et al., "Machining on Rear Surface of a Silicon Substrate by an Infrared Femtosecond Laser via Non-Linear Absorption Processes", In 18th CIRP Conference on Electro Physical and Chemical Machining (ISEM XVIII), 2016, pp. 73-76.

Molian, et al., "Picosecond pulsed laser ablation and micromachining of 4H—SiC wafers", In Applied Surface Science, 2009, pp. 4515-4520.

"International Preliminary Report on Patentability for PCT Patent Application No. PCT/US2018/025428", Mailed Date: Oct. 1, 2019, 7 Pages.

"Office Action for U.S. Appl. No. 16/498,960", Mailed Date: Dec. 21, 2021, 7 pages. (40614.04003).

"Notice of Preliminary Rejection for Korean Patent Application No. 10-2019-7031187", Mailed Date: Feb. 24, 2022, 12 pages.

"Written Opinion of the Intellectual Property Office of Singapore for Singapore Patent Application No. 11201908799R", Mailed Date: Oct. 7, 2020, 7 pages.

"Response to Written Opinion of the Intellectual Property Office of Singapore Mailed Oct. 7, 2020", filed Feb. 26, 2021, 13 pages.

"Response to the Office Action for U.S. Appl. No. 16/498,960", Filed Date: Mar. 21, 2022, 8 pages.

"Office Action for Israeli Patent Application No. 269709", Mailed Date: Mar. 15, 2022, 3 pages.

"Office Action for Japanese Patent Application No. 2020-502525", Mailed Date: Apr. 5, 2022, 4 pages.

"Notice of Allowance and Fees Due for U.S. Appl. No. 16/498,960", Mailed Date: Apr. 25, 2022, 7 pages.

"English Translation of Office Action for Japanese Patent Application No. 2020-502525", Mailed Date: Apr. 5, 2022, 5 pages.

* cited by examiner

THREE-DIMENSIONAL SEMICONDUCTOR FABRICATION

RELATED APPLICATIONS

This application is a continuation of U.S. patent application Ser. No. 16/498,960, filed on Sep. 27, 2019, and entitled "THREE-DIMENSIONAL SEMICONDUCTOR FABRICATION", which is a national stage application of PCT Patent Application No. PCT/US18/25428, filed on Mar. 30, 2018, and entitled "THREE-DIMENSIONAL SEMICONDUCTOR FABRICATION", which claims priority to U.S. Provisional Patent Application No. 62/480,259 filed on Mar. 31, 2017 and entitled "THREE-DIMENSIONAL SILICON FABRICATION," and to U.S. Provisional Patent Application No. 62/618,205 filed on Jan. 17, 2018 and entitled "THREE-DIMENSIONAL SEMICONDUCTOR FABRICATION" the entireties of which are incorporated herein by reference.

BACKGROUND

Microfabrication refers to a variety of techniques that are used to manufacture integrated circuits (ICs) and micro-electro-mechanical systems (MEMS). ICs and MEMS manufactured by way of conventional microfabrication techniques have feature sizes on the order of microns or nanometers. Conventionally, microfabrication of ICs and MEMS is a layer-by-layer process wherein layers of semiconductors (and various other materials) are deposited, patterned with lithographic tools, and then etched to define a portion of the final geometry. Generally, these conventional microfabrication techniques are limited to creating structures with shapes that are analogous to two-dimensional extruded geometries, sometimes referred to as 2.5 D.

Furthermore, these conventional microfabrication techniques are complex, time-consuming, and costly. In an example, fabrication of a single layer of a device can include steps of 1) depositing a thin film on a substrate or wafer, 2) coating the thin film with a photoresist masking layer, 3) photolithographic patterning of the photoresist masking layer, 4) etching the thin film layer through the photoresist masking layer, 5) stripping the photoresist masking layer, and 6) thoroughly cleaning the substrate or wafer prior to a subsequent layer being deposited and patterned in similar fashion.

SUMMARY

The following is a brief summary of subject matter that is described in greater detail herein. This summary is not intended to be limiting as to the scope of the claims.

Various technologies pertaining to fabrication of structures in a semiconductor by way of selective etching of the semiconductor are described herein. These technologies are suitable for manufacturing a variety of three-dimensional (3D) structures in a semiconductor (e.g., three-dimensional voids). Furthermore, these technologies are suitable for etching structures in a semiconductor with smaller feature sizes than are typically possible with conventional selective etching techniques.

In various exemplary embodiments, a semiconductor is etched by way of electrochemical reactions at a surface of the semiconductor that is exposed to an etchant solution. The exposed surface of the semiconductor is etched selectively based upon controlled creation of holes in the atomic lattice of the semiconductor (i.e., absences of electrons in the lattice that are commonly modeled as positively-charged particles called holes). In the etching reaction, holes at the exposed surface of the semiconductor cause oxidation of the semiconductor, which oxidation is subsequently etched by the etchant solution. Holes are selectively created by illumination of the semiconductor by an illumination source (e.g., a laser) that has an energy below the bandgap energy of the semiconductor. Single sub-bandgap energy photons do not have sufficient energy to move electrons in the semiconductor from the valence band to the conduction band. Thus, ordinarily sub-bandgap energy light is unable to create holes in the atomic lattice of the semiconductor. The sub-bandgap energy light emitted by the illumination source is focused to a sufficiently intense focal spot to cause multi-photon absorption (MPA) within the semiconductor. When this occurs, the photon energy of multiple photons is combined to exceed the bandgap energy of the semiconductor, exciting electrons from the valence band to the conduction band and thereby creating holes in the atomic lattice of the semiconductor at the focal spot of the illumination source. Holes can be selectively created in a region near the focal spot of the illumination source where etching is desirably performed, thereby limiting the etching to a region near the focal spot.

Since the light emitted by the illumination source is sub-bandgap-energy light that does not experience linear absorption, the semiconductor is transparent to the light emitted by the illumination source. By moving the focal spot of the illumination source within the body of the semiconductor, etching of the semiconductor can be selectively controlled to occur at positions that cannot be etched according to conventional semiconductor etching methods. Three-dimensional features can therefore be etched within the body of the semiconductor that are not readily created by conventional microfabrication techniques. In an exemplary embodiment, the illumination source can be positioned facing a second surface (e.g., a backside surface) of the semiconductor opposite the surface exposed to the etchant solution. In the embodiment, the illumination source emits light toward the second surface of the semiconductor and through the semiconductor to the focal spot within the semiconductor body. Illumination of the semiconductor through the second surface opposite the etching surface avoids potential scattering of the emitted light, which can cause undesired etching of the semiconductor or can lower achievable resolution of semiconductor features.

In other exemplary embodiments, the illumination source is controlled by way of a computing device that incorporates a physics model of charge-carrier transport within the semiconductor. In general, a hole generated at a first location in a semiconductor can move within the semiconductor subject to various forces caused by electric fields, carrier diffusion etc. In some instances, therefore, holes created at the first location in the semiconductor may move to a location in the semiconductor other than a location that is desirably etched. By incorporating a physics model of charge-carrier transport, the computing device can control the illumination source such that holes are created by the emitted light at locations where they will ultimately migrate to desired etching locations. By way of example, the computing device is provided with a desired etch location in the semiconductor. The computing device outputs a prediction based upon the physics model, where the prediction indicates that a hole created at a first location is expected to migrate to the desired etch location. The physics model can output the prediction based upon charge-carrier diffusion in the semiconductor, an electric field applied to the semiconductor (e.g., by way of a bias voltage), and a current flow in the electrochemical cell that drives the etching reaction. The computing device then controls the output of the illumination source to cause the illumination source to illuminate the semiconductor with its focal spot at the first location predicted by the physics model.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
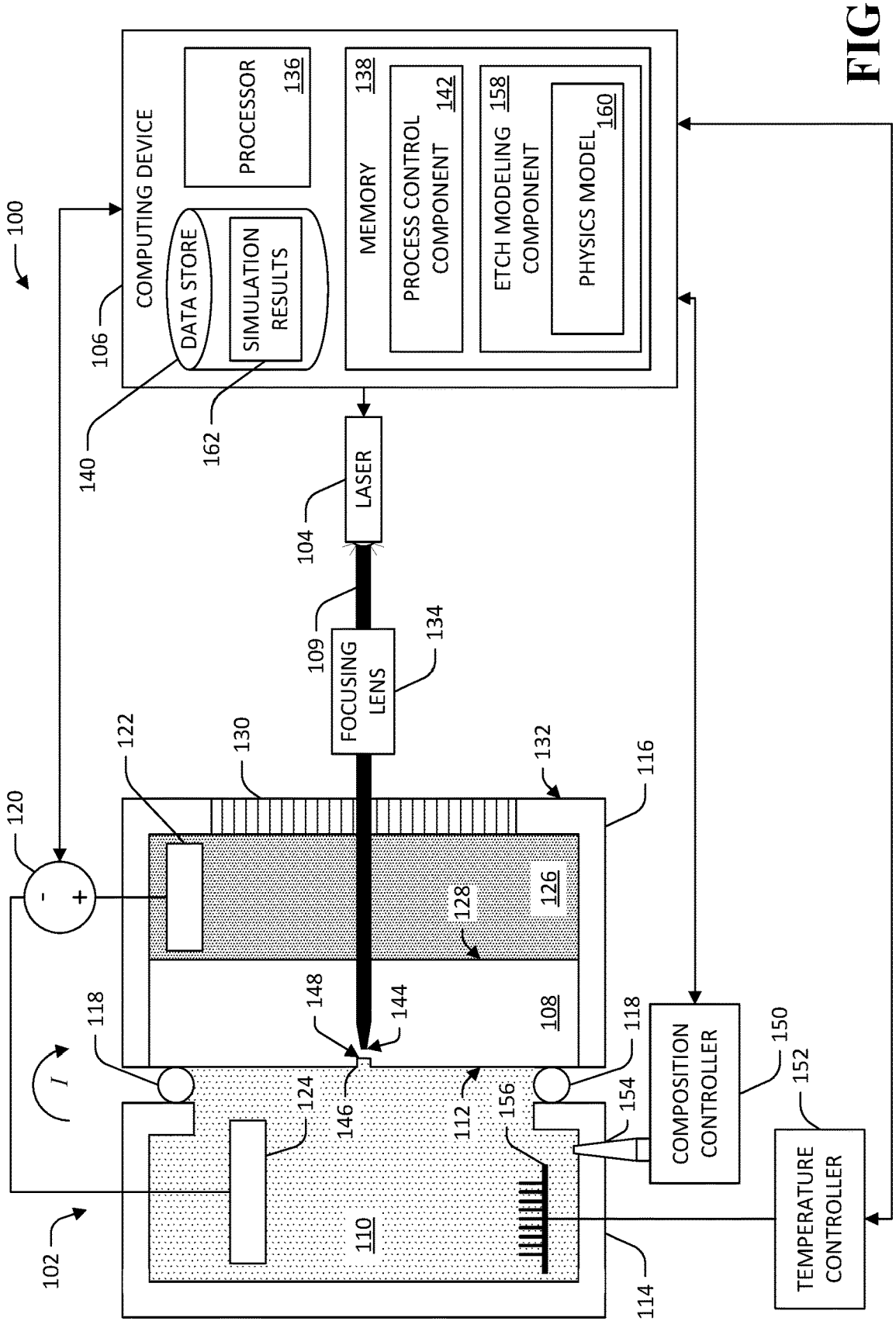
FIG. 1 is a diagram of an exemplary system that facilitates selective etching of a semiconductor controlled by way of a sub-bandgap-energy laser.

Various technologies pertaining to photo-controlled selective semiconductor etching are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

It is to be understood that as used herein, a "hole" in a semiconductor lattice refers to the absence of an electron at a location in the semiconductor lattice. While reference is made herein to various acts and occurrences relative to holes as tangible entities, it is to be understood that such explanation is merely intended to facilitate understanding of various aspects, and may reflect some inaccuracy in an underlying physical process. For instance, while reference is made herein to electric fields exerting forces on holes and causing hole motion, it is to be understood that electric fields actually exert forces on electrons in a semiconductor lattice thereby causing electron motion, whereas results of such motion may be suitably described by conceptualizing a hole as a virtual particle. Such references to holes are made in order to facilitate understanding, and are consistent with descriptions commonly employed in the art of semiconductor fabrication.

With reference to FIG. 1, an exemplary system 100 that facilitates selectively controlled semiconductor etching is illustrated. The system 100 includes an etching chamber 102, a laser 104, and a computing device 106 that controls the laser 104. The etching chamber 102 contains a semiconductor element 108 that is desirably etched and an etching solution 110 that selectively oxidizes and etches the semiconductor 108 at locations where holes exist in the atomic lattice of the semiconductor 108. The laser 104 emits a beam of light 109 at the semiconductor 108 based on control signals received from the computing device 106 in order to create holes at particular regions in the semiconductor 108. The semiconductor 108 is then etched by the etching solution 110 at locations where the created holes migrate to a first surface 112 of the semiconductor 108 that is exposed to the etching solution 110. Hence, the laser 104 is controlled to cause the semiconductor 108 to be etched at desired locations based upon where the laser 104 creates holes in the semiconductor 108.

Composition of the etching solution 110 is selected based upon a chemical makeup of the semiconductor 108. By way of example, and not limitation, in applications where the semiconductor 108 comprises silicon or other carbon group elements (e.g., silicon, carbon, germanium, etc.), the etching solution 110 can comprise hydrofluoric acid (HF). For example, the etching solution 110 can be a solution of between 1% and 30% HF. In other embodiments, other chemicals that provide fluorine atoms for the reaction can also be used, such as ammonium hydroxide/ammonium fluoride. In various embodiments, the etching solution 110 can include surfactants (e.g., ethanol, Dimethylformamide, acetonitrile, etc.) that enhance wetting of the etching solution 110 to the surface 112 of the semiconductor 108 and can facilitate removal of etch gases from the surface 112 of the semiconductor 108. It is to be understood that methods and systems described herein are suitable for selective etching of a variety of semiconductors. In some exemplary embodiments, the semiconductor 108 comprises an intrinsic elemental semiconductor such as silicon, carbon (diamond, graphene, carbon nanotubes, etc.), germanium, etc. In other exemplary embodiments, the semiconductor 108 comprises a group III-V semiconductor (e.g., gallium arsenide, indium phosphide, etc.), a group III-nitride (e.g., gallium nitride, indium gallium nitride, etc.), a group II-VI semiconductor (e.g., zinc oxide, cadmium telluride, etc.) or other semiconductor compounds (e.g., silicon carbide, silicon germanium, etc.). A composition of the etching solution 110 can be selected to facilitate etching of the desirably etched semiconductor.

Various details pertaining to configuration and operation of the system 100 in connection with selectively etching the semiconductor element 108 are now described. The etching chamber 102 comprises a first containment vessel 114 and a second containment vessel 116. The first containment vessel 114 contains the etching solution 110. The vessels 114, 116 are joined by a seal 118 (e.g., an O-ring, where the vessels 114, 116 are annular) that prevents escape of the etching solution 110 from the etching chamber 102. The semiconductor 108 is positioned in the second containment vessel 116 such that the first surface 112 of the semiconductor 108 is exposed to the etching solution 110.

The system 100 further comprises a voltage source 120 that establishes an electric field in the semiconductor that facilitates the etching reaction at the surface 112 of the semiconductor 108. The voltage source 120 is connected to an anode electrode 122 and a cathode electrode 124 at positive and negative terminals of the voltage source 120, respectively. The anode electrode 122 is positioned within the second containment vessel 116 in contact with a conductive material 126. The conductive material 126 is placed in contact with a second surface 128 of the semiconductor 108 that is opposite the surface 112 that is exposed to the etching solution 110. When a voltage is applied to the electrodes 122, 124 by the voltage source 120, an electric field is established within the semiconductor 108 that can be used to direct charge-carriers to desired locations within the semiconductor 108. For instance, the voltage source 120 can be controlled to establish an electric field within the semiconductor 108 that tends to cause positive charge-carriers, such as holes, to migrate toward the etching surface 112.

The second containment vessel 116 further comprises a window 130 positioned at an outer surface 132 of the vessel 116 and extending through the surface 132 to face the backside surface 128 of the semiconductor 108 (i.e., the surface opposite the surface being etched). The window 130 is transparent to the beam 109 emitted by the laser 104. The laser 104 is positioned facing the window 130 and emits the beam 109 through the window 130 toward the backside 128 of the semiconductor 108. The conductive material 126 is selected or configured to be transparent to the beam of light 109 emitted by the laser 104. By way of example, and not limitation, the conductive material 126 can be salt water, an acid, a base, a transparent conductive oxide, a very thin metal film (e.g., 10-50 nm), a metal mesh, graphene, carbon nanotubes, a transparent conductive polymer, etc. In another exemplary embodiment, the conductive material 126 can be a weak HF solution. Where the etching solution 110 comprises HF, use of a HF solution as the conductive material 126 can inhibit undesired reactions between the etching solution 110 and the conductive material 126 should they come into contact. The system 100 can further include a focusing lens 134 (e.g., an objective lens, or a custom optical focusing element) that receives the beam 109 from the laser 104 and focuses the beam 109 through the window 130 to a focal spot within the semiconductor element 108. The beam 109 would be a focal cone after exiting the focusing lens 134, however, for simplification and illustrative purposes the beam 109 (and in some subsequent figures) is shown as a straight beam until it reaches its focal position 144.

The computing device 106 comprises a processor 136, memory 138 that is operably coupled to the processor 136, and a datastore 140 operably coupled to the processor 136. The memory 138 includes instructions that, when executed by the processor 136 cause the processor 136 to perform various functions. a process control component 142 that controls various aspects of a process for selectively etching the semiconductor 108. For example, the process control component 142 controls orientation and positioning of the laser 104 and/or the focusing lens 134 in connection with illuminating particular locations in the semiconductor 108. The process control component 142 can also be configured to control other etch input variables such as intensity of the beam 109, the bias voltage applied by the voltage source 102, temperature of the etching solution 110, etc.

Operations of the system 100 in connection with selectively etching the semiconductor 108 are now described. Etching of the semiconductor 108 by the etching solution 110 occurs based upon a series of chemical reactions that are carried out at the etching surface 112 of the semiconductor 108 in the presence of holes in the atomic lattice at the surface 112. For example, in an exemplary embodiment wherein the semiconductor 108 comprises silicon and the etching solution 110 comprises hydrofluoric acid, the etching reaction is the following two-step electrochemical reaction:

$$Si + 2F^- + 2h^+ \rightarrow SiF_2 \qquad (1)$$

$$SiF_2 + 2HF \rightarrow SiF_4 + H_2 \qquad (2)$$

In the chemical reaction shown in Equation 1, positively charge holes at the surface of a silicon semiconductor facilitate a reaction between negatively charged fluorine ions and neutral silicon to yield $SiF_2$ at the surface. The chemical reaction of Equation 2 is the etching reaction, whereby the HF etching solution reacts with the $SiF_2$ to yield $SiF_4$ and $H_2$ gases. The electrochemical etching reaction described by Equations 1 and 2, therefore, can be controlled by controlling a quantity and location of holes in the semiconductor. Where holes are present, etching can occur, and where holes are absent etching does not occur. Other alternative chemical reaction equations have been proposed for silicon electrochemical etching of silicon with an intermediate silicon oxide step. In general, various proposed reaction equations and experimental results demonstrate a need for holes for the etch to occur.

In the exemplary system 100, holes are created by illumination of the semiconductor 108 by the laser 104. Since an electrochemical etching reaction of the etching solution 110 with the semiconductor 108 is facilitated by the presence of holes, etching of the semiconductor 108 can be controlled based upon illumination of the semiconductor 108 by the laser 104. In order to create a hole in a semiconductor, sufficient energy must be imparted to an electron in the lattice of the semiconductor to allow the electron to bridge the bandgap of the semiconductor from the valence band to the conduction band. Conventionally, therefore, holes have been created in semiconductors using a laser wherein each photon has an energy greater than the bandgap energy of the semiconductor.

By contrast, the laser 104 is a laser that emits light wherein the photon energy is less than the bandgap energy of the semiconductor 108. Sub-bandgap-energy light is ordinarily not absorbed by the semiconductor 108, and thus the semiconductor 108 is typically transparent to the beam 109 emitted by the laser 104. The focusing lens 134 is configured to focus the beam 109 to an intense focal spot 144 in the semiconductor 108. Whereas ordinarily sub-bandgap-energy light does not impart sufficient energy to an electron to cause the electron to be freed from its location in the lattice of the semiconductor (thereby creating a hole), when the focusing lens 134 focuses the beam to the intense focal spot 144, MPA can occur whereby multiple photons impart energy to an electron substantially simultaneously. When an electron absorbs multiple photons each having an energy below the bandgap energy, sufficient energy can be imparted to cause the electron to move from the valence band to the conduction band, thereby creating a hole.

Figure 2:
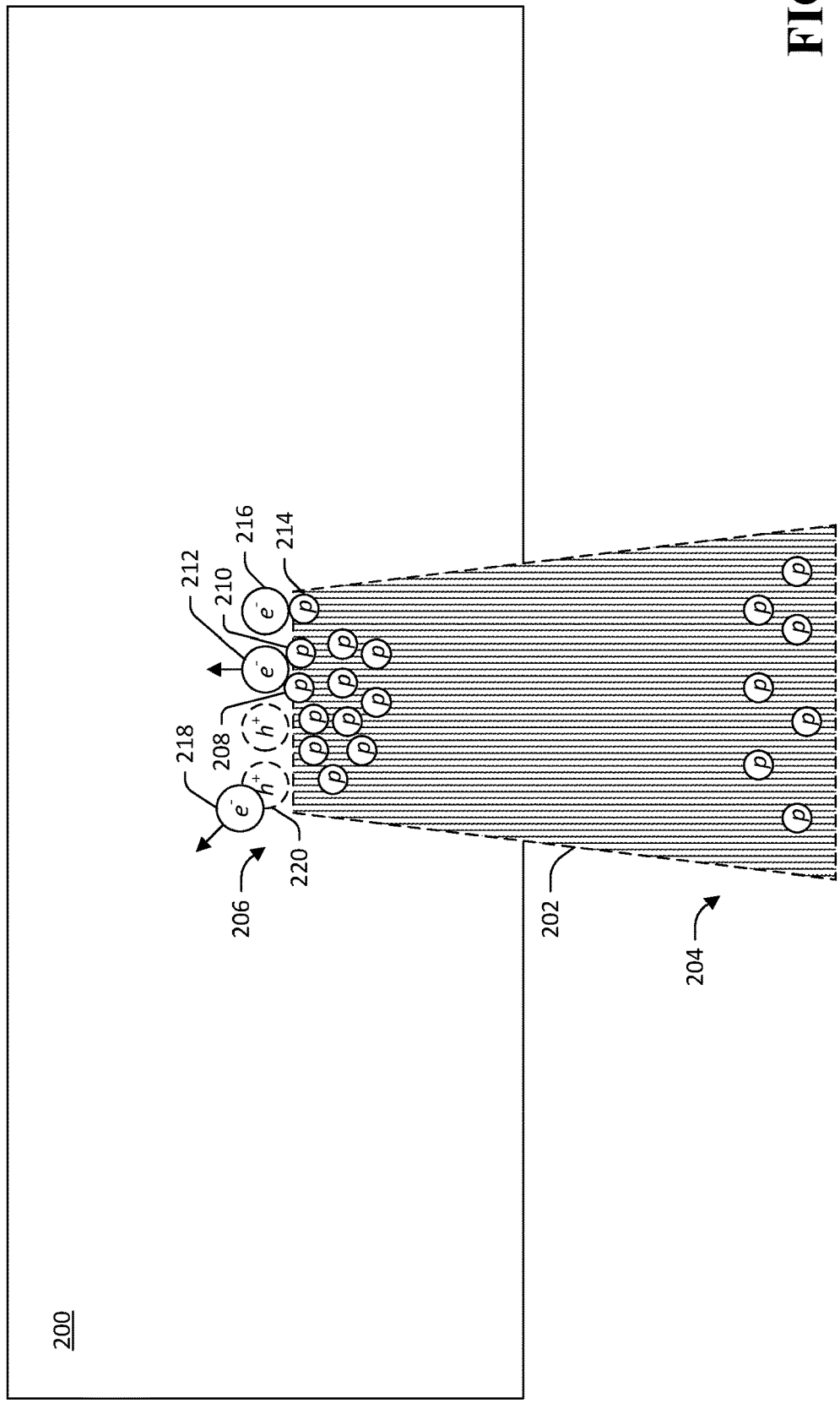
FIG. 2 is a conceptual diagram of MPA in a vicinity of a focal spot of a sub-bandgap-energy illumination source.

By way of illustration, and referring now to FIG. 2, a conceptual diagram of creation of holes in the atomic lattice of a semiconductor is shown. It is to be understood that while certain aspects pertaining to electrons, photons, and holes are depicted and described with respect to FIG. 2, such aspects are intended only as a conceptual illustration to facilitate understanding of an underlying physical process and are not intended as a fully accurate depiction of sub-atomic physical processes. FIG. 2 depicts a snapshot view of a semiconductor 200 that includes a plurality of electrons $e^-$. The electrons $e^-$ are constrained to be either in the valence band of the semiconductor 200 or the conduction band of the semiconductor 200. FIG. 2 further depicts a beam 202 of light, e.g., as emitted by a laser. As shown in FIG. 2, the beam 202 includes a plurality of photons p, wherein each of the photons p has an energy below the bandgap energy of the semiconductor 200.

Initially, the beam 202 is unfocused in a region 204. In the unfocused region 204, the beam 202 is unlikely to impart sufficient energy to an electron to cause the electron to cross the bandgap from the valence band to the conduction band, as it is unlikely that two or more photons will impart energy to an electron simultaneously. The beam 202 comes into focus at a focal spot 206 within the semiconductor 200. At the focal spot 206, fluence of the beam 202 (i.e., energy per unit area) increases relative to the unfocused region 204. Thus, at the focal spot 206 it is more likely that two or more photons will impart energy to an electron at substantially the same time. MPA occurs at the focal spot 206 of the beam 202. For instance, as shown in FIG. 2, two photons 208, 210 arrive simultaneously at an electron 212. The photons 208, 210 impart sufficient energy to cause the electron 212 to move from its position in the atomic lattice of the semiconductor 200, as indicated by the arrow extending from the electron 212. By contrast, only a single photon 214 arrives at another electron 216 at the snapshot of time depicted in FIG. 2. Since the photons p of the beam 202 have a sub-bandgap energy, the single photon 214 is insufficient to impart enough energy to the electron 216 to cause the electron 216 to move from its position in the lattice and, therefore, photon 214 is not absorbed and electron 216 does not leave the valence band. When an electron $e^-$ leaves its position in the lattice of the semiconductor 200 a positively-charged hole $h^+$ remains behind. For example, an electron 218 is depicted as moving away from a position in the lattice while a hole 220 remains in its place.

Referring again to FIG. 1, holes are created at the focal spot 144 by MPA of the sub-bandgap-energy light of the beam 109 by electrons in the atomic lattice of the semiconductor 108 at the focal spot 144. Holes created at the focal spot 144 can migrate to the etching surface 112, causing oxidation and subsequent etching of the semiconductor 108 at locations of holes at the surface 112. By way of example, the semiconductor 108 comprises an etched feature 146 that extends into the semiconductor 108 from the surface 112. As holes created at the focal spot 144 migrate to a bottom surface 148 of the etched feature 146, the etching solution 110 oxidizes and etches the bottom surface 148 of the feature 146 to further extend the feature 146 into the body of the semiconductor 108.

The process control component 142 can control various parameters of the electrochemical etching of the semiconductor 108 by the etching solution 110 in the etching chamber 102 to facilitate etching of desired features. In an example, an electrical field can be established and variably controlled to affect a size or shape of a feature etched in the semiconductor 108. In the system 100 the computing device 106 is in communication with the voltage source 120, and the process control system 142 is configured to control an output of the voltage source 120. The process control system 142 can control the voltage source 120 to establish an electric field in the semiconductor 108. The electric field can be maintained such that holes are swept to the etching surface 112, as referenced above. Establishment of the electric field in the semiconductor 108 by way of the voltage source 120 facilitates performance of selective etching of the surface 112 of the semiconductor 108 by directing holes to desired locations in the lattice of the semiconductor. Various internal electric fields (not due to the voltage source 120) within the semiconductor 108 exert forces on holes in the semiconductor 108 that can cause semiconductor drift. Further, holes diffuse through the semiconductor 108 from areas of higher concentration to areas of lower concentration. Establishing an electric field within the semiconductor 108 using the voltage source 120 can reduce an effect of other electric fields and carrier diffusion on an ultimate position of a hole at the surface 112 of the semiconductor 108 by reducing a time between generation of the hole at the focal spot 144 of the laser 104 and the hole reaching the surface 112.

Figure 3:
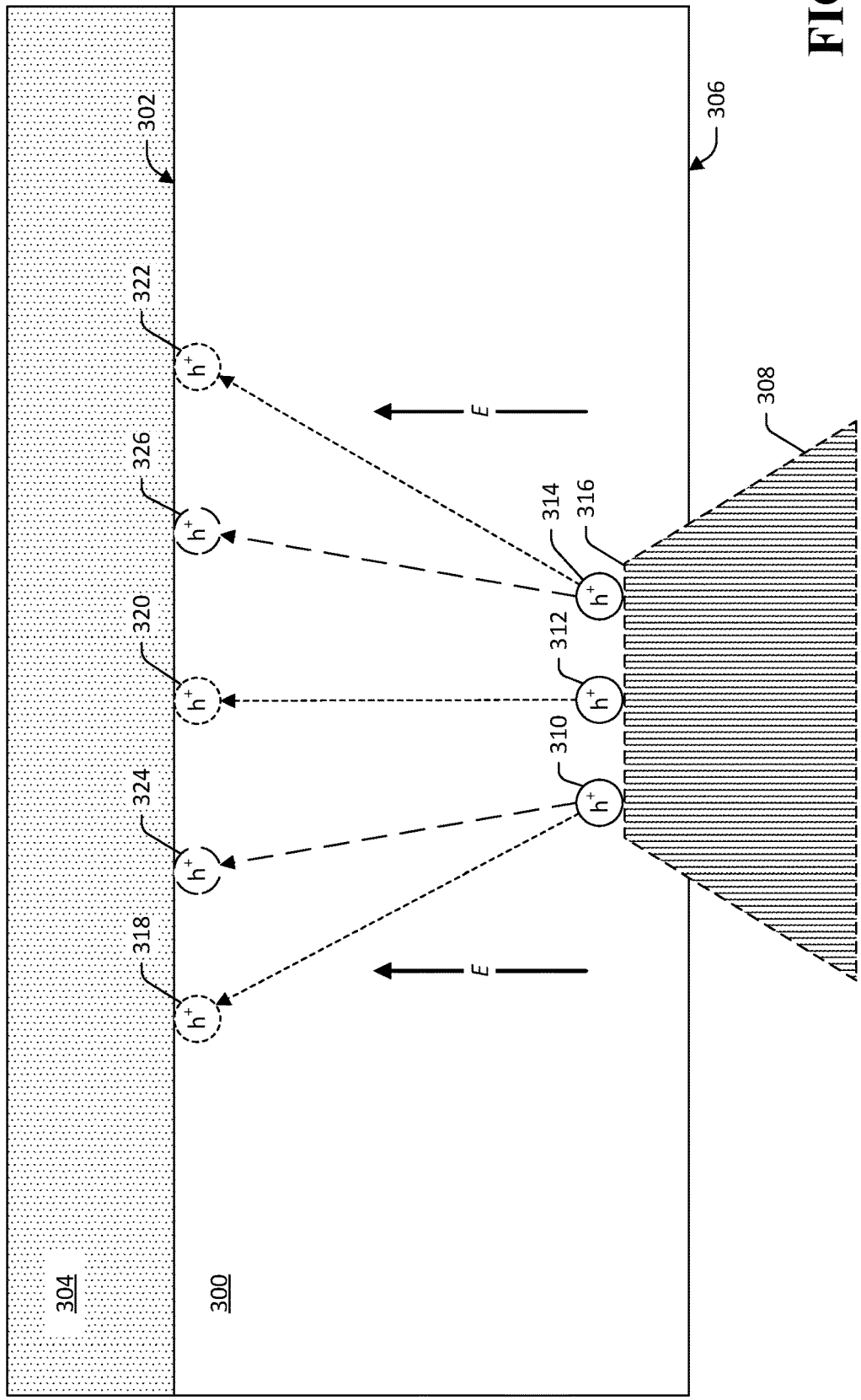
FIG. 3 is a conceptual diagram of hole drift under the influence of induced electric fields.

By way of example, and referring now to FIG. 3, a diagram depicting migration of holes under the influence of two different electric fields is illustrated. FIG. 3 depicts a semiconductor element 300 that comprises a first surface 302 that is exposed to an etching solution 304 and a second surface 306 opposite the first surface 302, wherein a beam of sub-bandgap-energy light 308 enters the semiconductor 300 through the second surface 306. The beam 308 generates a plurality of holes 310-314 at a focal spot 316 of the beam 308 that is positioned within the semiconductor 300. The holes 310-314 migrate toward the etching surface 302 of the semiconductor 300 under the influence of an electric field E. For a first intensity of the electric field E, the holes 310-314 migrate to respective positions 318-322. If the electric field E is increased to a second, greater intensity (e.g., by increasing a voltage output of the voltage source 120 in the system 100), the holes 310-314 may be swept to the etching surface 302 more quickly. As shown in FIG. 3, under the influence of an electric field having the second, greater intensity, the holes 310, 314 migrate to respective positions 324, 326 that are closer together than the positions 318, 322. Therefore, a size (e.g., a diameter) of an etch feature for a given set of illumination parameters (e.g., size, position, intensity of the focal spot of the laser) can be increased by reducing the intensity of the electric field E or can be decreased by increasing the intensity of the electric field E.

Still other parameters of the system 100 can be controlled by the process control component 142 in connection with etching desired features in the semiconductor 108. In an exemplary embodiment, the process control component 142 outputs a control signal to the laser 104 and/or the focusing lens 134 that causes the laser 104 and/or the focusing lens 134 to adjust size, intensity, or positioning of the focal spot 144 within the semiconductor 108 to affect a resultant etch.

Figure 4:
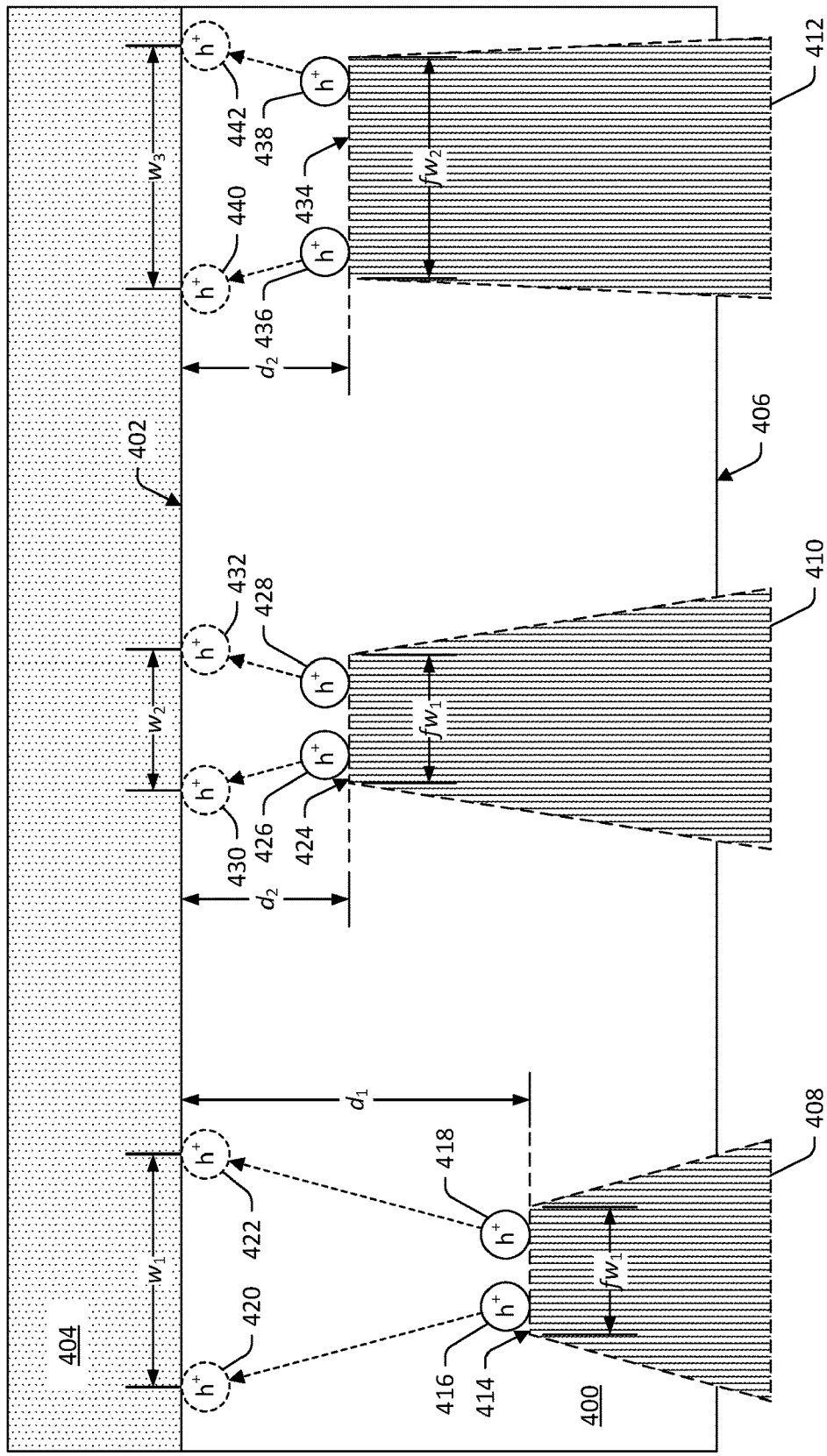
FIG. 4 is a conceptual diagram illustrating generation and migration of holes in a semiconductor.

By way of example, and referring now to FIG. 4 a diagram depicting differences in migration of holes within a semiconductor for various sizes and positions of a focal spot is illustrated. FIG. 4 depicts a semiconductor element 400 that comprises a first surface 402 that is exposed to an etching solution 404 and a second backside surface 406 opposite the first surface 402, wherein beams 408-412 of sub-bandgap-energy light are depicted as entering the semiconductor 400 through the backside surface 406. Each of the beams 408-412 has a different combination of focal spot size and position relative to the etch surface 402. The beam 408 has a focal spot 414 with a focal spot width $fw_1$ positioned at a depth of $d_1$ away from the etching surface 402. Holes 416, 418 are depicted as being initially spaced a maximal distance of $fw_1$ apart at the focal spot 414. Due to carrier diffusion, internal or induced electric fields, or other various forces, the holes 416, 418 migrate to positions 420, 422 at the etch surface 402 of the semiconductor 400. The positions 420, 422 are positioned a width $w_1$ apart, where a value of $w_1$ depends on various etch parameters described herein. Similarly, the beam 410 has a focal spot 424. The focal spot 424 of the beam 410 has the same focal spot width $fw_1$ as the focal spot 414 of the first beam 408, but the focal spot 424 is positioned at a shallower depth $d_2$ than the depth $d_1$ of the first focal spot 414. As a result, all else being equal, holes 426, 428 generated at a maximal distance of $fw_1$ apart at the focal spot 424 migrate to respective second positions 430, 432 at the etching surface 420 that are spaced a smaller width $w_2$ apart than the width $w_1$. For a same-size focal spot, a size of an etch feature at the etch surface of the semiconductor can be increased by increasing a distance between the focal spot and the etch surface.

A width of the focal spot can also affect a width of a resultant etch feature. Still referring to FIG. 4, the third beam 412 has a focal spot 434 positioned at the same depth $d_2$ as the focal spot 424 of the second beam 410. The focal spot 434 of the third beam 412 further has a focal spot width $fw_2$ that is greater than the focal spot width $fw_1$ of the second beam 410. Holes 436, 438 are depicted as being generated at a maximal distance of $fw_2$ apart at the focal spot 434. The holes 436, 438 are shown as migrating to respective second locations 440, 442 at the etch surface 402, the locations 440, 442 spaced a width $w_3$ apart. The width $w_3$ is greater than the width $w_2$ indicating that, all else being equal, the greater focal spot width $fw_2$ yields a greater etch feature width $w_3$.

Figure 5:
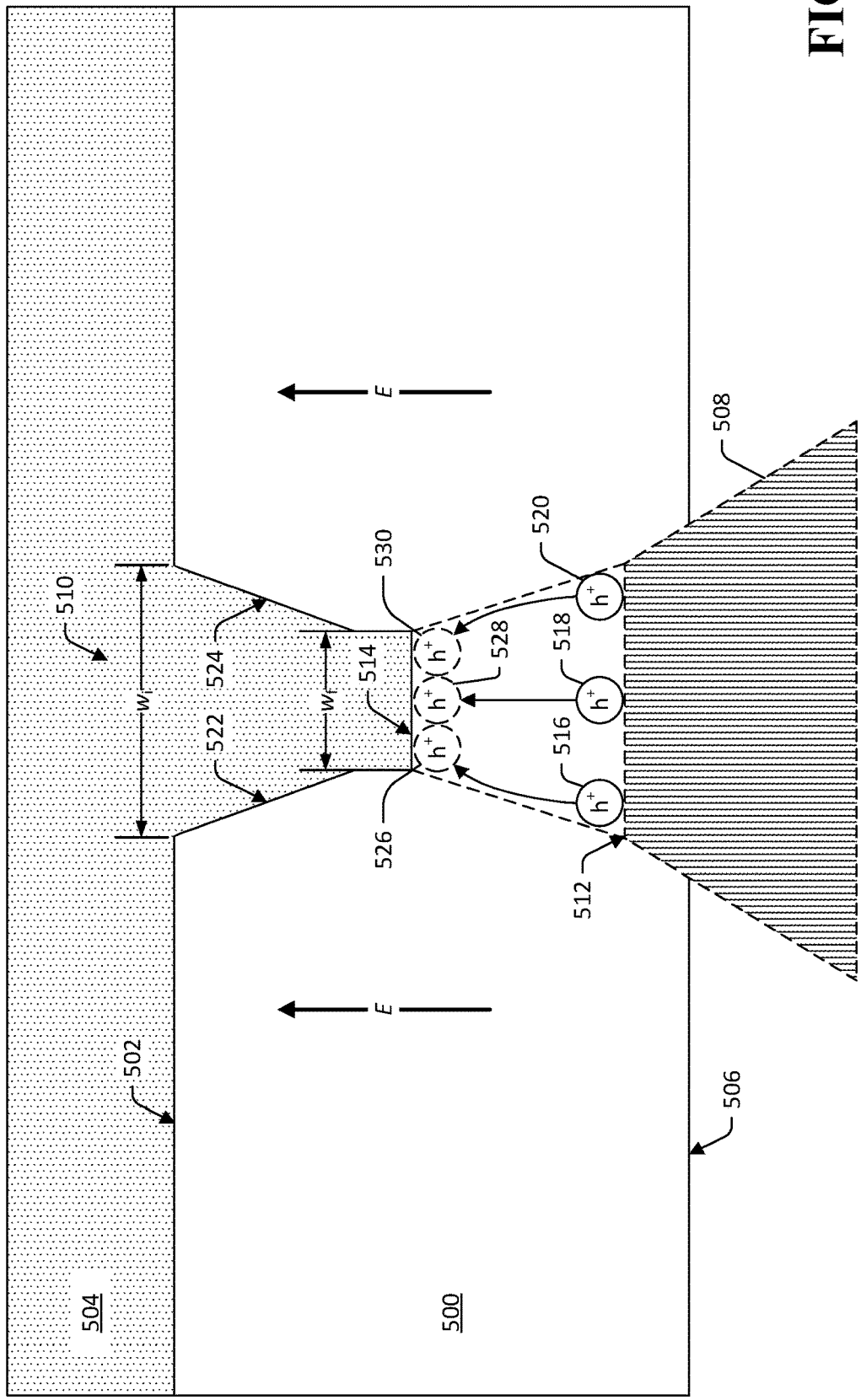
FIG. 5 is a conceptual diagram illustrating electric field focusing effects on migration of holes in a semiconductor.

A position of the focal spot 144 of the laser 104 can further be controlled relative to positions of existing etched features in the semiconductor 108 to affect a resultant size or shape of an etched feature. For example, the focal spot 144 can be positioned in close proximity to a surface of an etched feature in the semiconductor 108 (e.g., within 10 nanometers of the surface of the feature to within 10 to 200-microns of the surface of the feature or more depending on the carrier diffusion length of the specific semiconductor), such that internal electric fields established by the geometry of the etched feature alter motion of holes created at the focal spot 144. In a non-limiting example, and referring now to FIG. 5, a diagram of an exemplary etch of a semiconductor 500 is shown, wherein holes are generated in close proximity to an existing etch feature to reduce a size of the etching. The semiconductor comprises a frontside surface 502 that is exposed to an etching solution 504 and a backside surface 506 through which a beam of sub-bandgap-energy light 508 enters the semiconductor 500. The semiconductor 500 includes a feature 510 etched in the surface 502 of the semiconductor 500. The feature 510 has an initial width $w_i$ at the surface 502. In an exemplary embodiment, the initial width $w_i$ is based on a width of a focal spot 512 of the beam 508, an intensity of an induced electric field E in the semiconductor 500, a relative difference in concentration of charge carriers between the surface 502 and the location of focal spot 512, etc. As the feature 510 extends into the semiconductor 500, the width of the feature 510 tapers to a smaller final width $w_f$, due to electric field focusing of charge-carriers at a tip 514 of the feature 510.

By way of illustration, a plurality of holes 516-520 are generated at the focal spot 512 of the beam 508. Under the influence of the induced electric field E, the holes 516-520 migrate from the focal spot 512 of the beam 508 toward the etching surface 502 of the semiconductor 500. In the absence of an existing feature, a smallest width of an etch feature at the surface 502 may be limited by a focal spot size of the beam 508. For example, in connection with initially etching the feature 510 at the surface 502 of the semiconductor 500, the initial width $w_i$ may be the width of the focal spot 512. As the feature 510 is etched into the semiconductor, surfaces of the feature 510 (e.g., interior surfaces 522, 524) cause the electric field lines (not pictured) to be bent from surface 506 towards the feature 510, and in particular towards the tip 514 of the feature 510. This change in the electric field due to feature 510 exert forces on holes as they migrate through the semiconductor 500. Accordingly, the holes 516-520 that are created at the focal spot 512 of the beam 508 are drawn toward the tip 514 of the feature 510 to positions 526-530 within the width $w_f$. Whereas absent the feature 510 the holes 516-520 may spread apart as they migrate toward the surface 502 (e.g., due to charge-carrier diffusion in the semiconductor 500), surfaces of the feature 510 draw the holes toward them.

In exemplary embodiments, the final width $w_f$ of the feature 510 is less than the width of the focal spot 512. Hence, and referring again to FIG. 1, by placing the focal spot 144 of the laser 104 near an etched feature in the semiconductor 108, features can be etched in the semiconductor 108 that have a smaller size than a resolution limit of the laser 104 and focusing lens 134. In one illustrative example, if the laser 104 has a minimum focal spot size of 500 nanometers, the process control component 142 can control the laser 104 to take advantage of electric field focusing to etch features having dimensions of as little as 10 nanometers.

Since sub-bandgap-energy light is not absorbed by the semiconductor 108 except at the focal spot 144 of the laser 104, the focal spot 144 can be positioned anywhere within the three-dimensional body of the semiconductor 108. This enables etching of three-dimensional features within the semiconductor 108 without requiring a direct straight-line path to the etching surface 112 of the semiconductor 108 as typically required in conventional etching based on photomasks.

Figure 6:
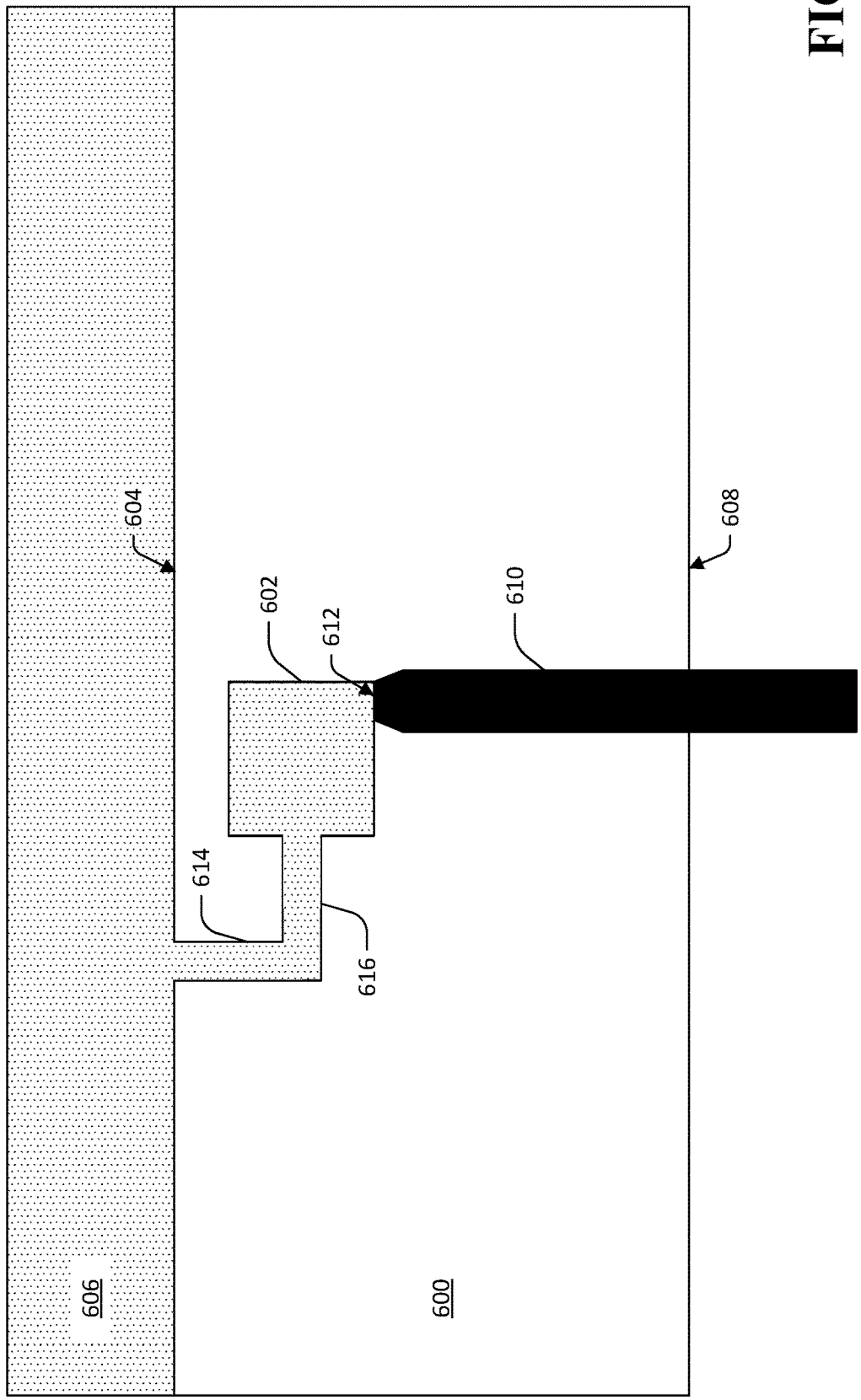
FIG. 6 is a diagram of an exemplary sub-surface semiconductor etch.

For example, and referring now to FIG. 6 an exemplary etching of a semiconductor 600 is depicted wherein a cavity 602 is formed within a body of the semiconductor 600. As shown in FIG. 6, the semiconductor 600 comprises a frontside surface 604 that is exposed to an etching solution 606 and a backside surface 608 through which a beam 610 of sub-bandgap-energy light enters the semiconductor 600. The cavity 602 is disposed within the bulk of the semiconductor 600 rather than being formed on a surface of the semiconductor 600. Since the semiconductor 600 is transparent to the beam 608 other than at a focal spot 612 of the beam 610, the focal spot 612 can be positioned to generate holes anywhere within the body of the semiconductor 600. In connection with etching the cavity 602, additional channel features 614, 616 are etched prior to the etching of the cavity 602. While a location of etching by the etching solution 606 can be controlled by controlling generation of holes in the semiconductor 600 using the beam 608, in order for a feature to be etched the etching solution 606 must be able to reach the feature. Hence, the first channel feature 614 is etched from the frontside surface 604 and into the bulk of the semiconductor 600. The second channel feature 616 is etched subsequent to the first channel feature 614, as the etching solution 606 is able to reach the second channel feature 616 by way of the first channel feature 614. Subsequently, the cavity 602 can be etched, as the etching solution 606 is able to reach the cavity 602 by way of the previously etched channel features 614, 616.

Figure 7:
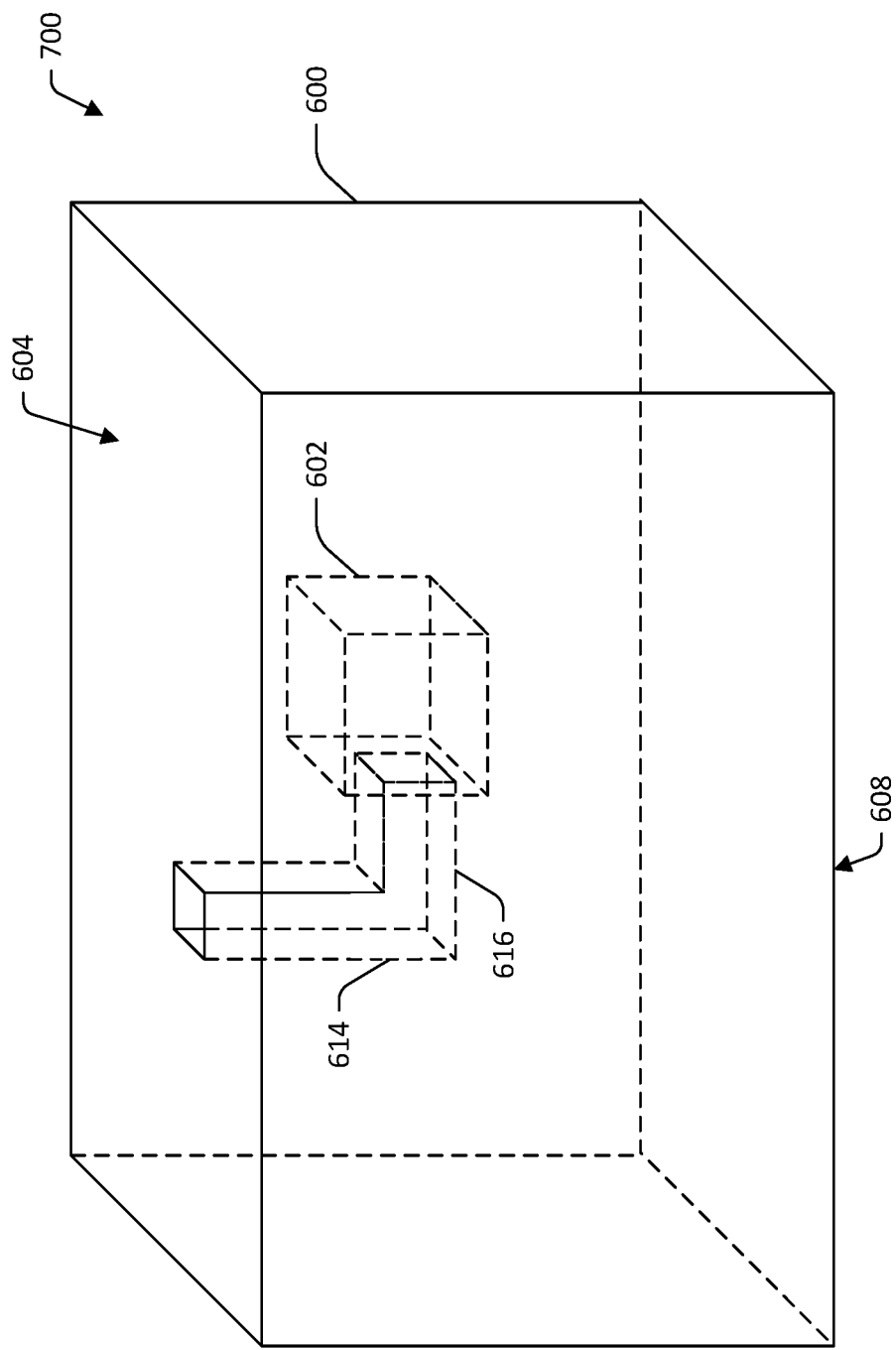
FIG. 7 is a three-dimensional representation of the sub-surface semiconductor etch depicted in FIG. 6.

It is to be understood that while various aspects pertaining to etched features are depicted in the Figures in two-dimensional form to facilitate understanding, the technologies described herein are suitable for etching features of substantially any shape in three dimensions. Referring now to FIG. 7, a three-dimensional representation 700 of the etched features 602, 614, 616 illustrated in FIG. 6 is shown. In the three-dimensional representation 700, the semiconductor 600 is shown to have a rectangular cubic shape. The first channel feature 614 is a rectangular channel feature extending from the frontside surface 604 into the body of the semiconductor 600. The second channel feature 616 is also a rectangular channel feature and extends horizontally outward from the first channel feature 614 in the body of the semiconductor 600. The cavity 602 is shown to be a cubic cavity that connects with the second channel feature 616, and thereby is connected to the frontside surface 604 of the semiconductor 600 by way of the two channel features 614, 616.

Referring once again to FIG. 1, the process control component 142 can further control temperature and composition of the etching solution 110 to maintain desired etch parameters. The system 100 further comprises a composition controller 150 and a temperature controller 152 in communication with the computing device 106. The composition controller 150 is coupled to the interior of the first containment vessel 114 by way of an opening 154 in the containment vessel 114. The composition controller 150 can be controlled by the process control component 142 to remove by-products of the etching reaction from the first containment vessel 114 and/or to introduce additional etching solution to maintain a target composition of the etching solution 110 within the containment vessel 114. The temperature controller 152 is coupled to heating/cooling device 156 that is positioned within the containment vessel 114. Responsive to receipt of control signals from the computing device 106, the temperature controller 152 controls the heating/cooling device 156 to heat or cool the etching solution 110 in the containment vessel 114 so as to maintain a target temperature of the etching solution 110 (e.g., as indicated in the control signals transmitted to the temperature controller 152 by the computing device 106).

It is to be understood that any or all of various forces, parameters, and variables described herein may affect migration of holes within the semiconductor 108. It will therefore be the case that holes created at one position may migrate to another position subject to a large number of variable physical parameters (e.g., temperature, voltage between electrodes 122, 124, size, intensity, and position of the focal spot 144, composition of the semiconductor 108, etc.). To facilitate etching of the semiconductor 108 according to a desired etch pattern, the memory 138 includes an etch modeling component 158 that outputs etch control instructions to the process control component 142 based upon an etch definition input to the computing device 106. Furthermore, feedback can be introduced into the control algorithm by monitoring the electrical current I flowing in the electrochemical etch cell (which is related to the rate of etching occurring), monitoring the current temperature of the etching solution 110, monitoring the products resulting from the etch process (e.g., as identified by the composition controller 150), or monitoring an image of the etch front as the etch proceeds.

Exemplary operations of the etch modeling component 158 and process control component 142 in connection with etching the semiconductor 108 according to a desired pattern are now described. An etch definition is provided to the etch modeling component 158, where the etch definition is indicative of position and dimensions of various features desirably etched in the semiconductor 108. Stated differently, the etch definition indicates a plurality of locations at which it is desired (e.g., by an operator of the system 100) that the semiconductor 108 be etched, wherein taken together the plurality of locations define the structure of one or more features to be etched. In exemplary embodiments, the etch definition comprises a computer-aided design (CAD) file that indicates dimensions of a semiconductor and respective positions and dimensions for one or more etch features in the semiconductor. The etch definition input to the etch modeling component 158 can further include one or more desired parameters of the etch. By way of example, and not limitation, the etch definition can include data indicative of a composition of the semiconductor 108, locations of existing etched features in the semiconductor 108, desired operating parameters of the laser 104 and/or the voltage source 120, etc.

The etch modeling component 158 is configured to output etch control instructions to the process control component 142 based upon the etch definition. The etch control instructions define control parameters for various aspects of the system 100 that are employed by the process control component 142 in connection with performing the desired etch described in the etch definition. In an exemplary embodiment, the etch control instructions include a plurality of positions of the focal spot 144 of the laser 104. In other examples, the etch control instructions can include data indicative of a composition of the etching solution 110, a temperature of the etching solution 110, a voltage output of the voltage source 120, etc.

In the exemplary system 100, the beam 109 is emitted into the backside surface 128 of the semiconductor 108 to avoid scattering of the beam 109 by already-etched features in the semiconductor 108, such as the feature 146. Scattering of the beam 109 by etched features in the semiconductor 108 can usually by avoided by illumination the semiconductor 108 with the laser 104 from the backside 128 and etching features nearest the etching surface 112 first before etching features that are further away from the etching surface 112. However, for more complicated three-dimensional structures, it may be necessary to etch features in a different order to avoid scattering of the beam 109. The etch modeling component 158 can be configured to generate the etch control instructions in order to minimize occasions of the beam 109 crossing an already-etched feature in the semiconductor 108.

In exemplary embodiments, the etch modeling component 158 generates the etch control instructions based upon a physics model 160 that is configured to output predictions of migration of holes within the semiconductor 108. In an example, a desired etch location is provided to the physics model 160 (e.g., as indicated in an etch definition provided to the etch modeling component 158) and the physics model 160 outputs a prediction that comprises an illumination location, wherein the prediction indicates that a hole generated at the illumination location is expected to migrate to the desired etch location. Stated differently, the physics model 160 receives a location of desired etching of the semiconductor 108 and outputs a prediction of where the focal spot 144 of the laser 104 can be positioned to result in the desired etch.

The physics model 160 generates an illumination location prediction for a desired etch location based upon various parameters that affect motion of holes in the semiconductor 108. Such physical effects include, but are not limited to, charge-carrier diffusion, an induced electric field within the semiconductor 108 (e.g., as caused by a voltage established between the electrodes 122, 124), a current flow I through an electrochemical cell that comprises the conductive material 126, the semiconductor 108, the etching solution 110, the electrodes 122, 124, and the voltage source 120, etc. In connection with generating an illumination location prediction, the physics model 160 can further model effects due to these parameters based on other underlying data that may affect a modeled physical process. For example, the physics model 160 can model effects of charge-carrier diffusion based on a composition of the semiconductor 108 and concentrations of dopants or other impurities in the semiconductor 108. In another example, the physics model 160 can model effects of an induced electric field based upon a voltage applied between the electrodes 122, 124.

The physics model 160, in addition to receiving data pertaining to desired etch parameters (e.g., as specified in an etch definition submitted to the etch modeling component 158), receives data pertaining to a present state of one or more operating parameters of the system 100. For example, the process control component 142 can in real-time output data to the physics model 160, the data indicative of the current flow I, the current flow I indicative of a reaction rate of the etching reaction (e.g., the reaction described by Equations 1 and 2 above). Hence, the physics model 160 can continually generate updated predictions of illumination locations for desirably etched features based on data pertaining to a current state of the system 100. The etch modeling component 158 can generate updated control instructions based upon the predictions and transmit the updated control instructions to the process control component 142 to facilitate control of the system 100 by the process control component 142 based on up-to-date information about system state.

In other exemplary embodiments, the physics model 160 can be configured to generate an illumination location prediction based upon simulation results 162 that are stored in the data store 140. In an embodiment, the simulation results 162 include results of a large number (e.g., hundreds or thousands or more) of simulated etches of a semiconductor according to various etch parameters. The physics model 160 can be configured to execute machine learning algorithms over the simulation results 162 to identify results of a simulated etch that exhibit a similar etch pattern to a desired etch indicated in an etch definition received by the etch modeling component 158. The physics model 160 can then output an illumination location prediction based on the identified results.

While certain examples of physical effects that are modeled by the physics model 160 are described herein, it is contemplated that the physics model 160 can model substantially any physical process that can affect a resultant etch location of holes generated by the focal spot 144 of the laser 104 at an illumination location.

It is to be understood that the systems and methods for selective electrochemical etching of various semiconductors are suitable for etching features of various sizes. For example, features can be etched in accordance with the technologies described herein to have a size on the order of 10 nanometers to 1 micron, on the order of 10 microns to 1 millimeter, or features of arbitrarily large size.

Figure 8:
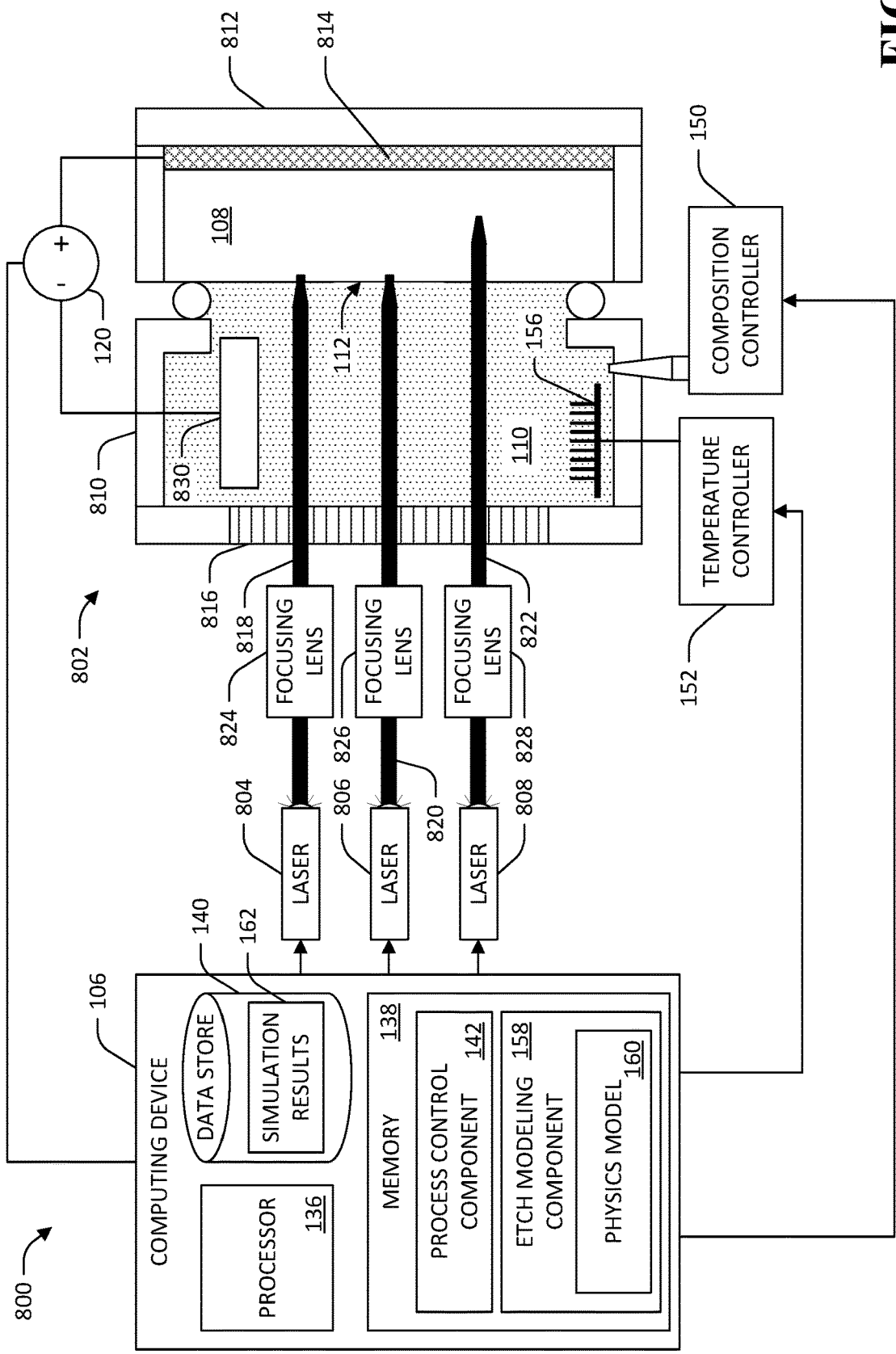
FIG. 8 is a diagram of another exemplary system that facilitates selective etching of a semiconductor controlled by a plurality of sub-bandgap-energy lasers.

While various aspects pertaining to an exemplary system 100 operable in connection with selective etching of a semiconductor are described in detail above, it is to be understood that other configurations are possible and contemplated as being within the scope of the present disclosure. Referring now to FIG. 8, another exemplary system 800 is shown wherein the semiconductor 108 is contained in an etching chamber 802 that is configured for frontside illumination by a plurality of sub-bandgap-energy lasers 804-808. The etching chamber 802 includes a first containment vessel 810 that contains the etching solution 110 and a second containment vessel 812 that contains the semiconductor 108 and a conductive element 814. The first containment vessel 810 further comprises a window 816 through which beams 818-822 emitted by respective lasers 804-808 are focused by respective focusing lenses 824-828 toward the frontside etching surface 112 of the semiconductor 108. It is to be understood that while the beams 818-822 are emitted toward the frontside surface 112 of the semiconductor 108, the beams 818-822 may be focused to respective focal spots within a body of the semiconductor 108 and underneath the surface 112. In the exemplary system 800, the voltage source 120 is connected between the conductive element 814 that makes electrical contact with the backside 128 of the semiconductor 108 and an electrode 830 that is positioned in the first containment vessel 810.

The process control component 142 of the computing device 106 can be configured to independently control the plurality of lasers 804-808 in order to facilitate faster etching of the semiconductor 108. For instance, since etching of the semiconductor 108 by the etching solution 110 is driven by holes that facilitate the etching reaction, simultaneous generation of holes at multiple locations in the semiconductor 108 by the lasers 804-808 enables several features to be etched simultaneously. It is to be understood that substantially any number of lasers may be included in a system for selective electrochemical etching of a semiconductor and controlled by the process control component 142. In other example it may be desirable for the process control component 142 to control a plurality of lasers to operate in parallel such that a same feature may be simultaneously etched a plurality of times in the semiconductor 108.

Figure 9:
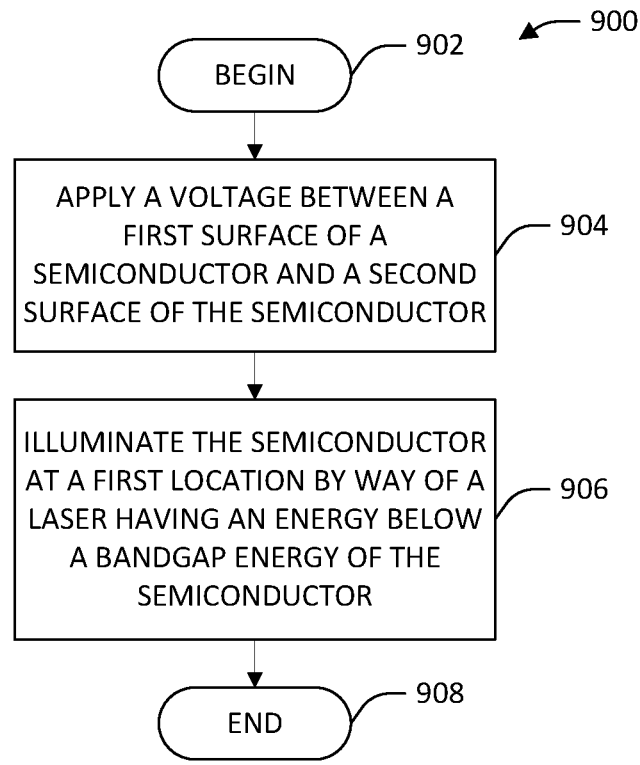
FIG. 9 is a flow diagram that illustrates an exemplary methodology for selective semiconductor etching controlled by a sub-bandgap-energy laser.

FIG. 9 illustrates an exemplary methodology relating to selective semiconductor etching driven by sub-bandgap-energy illumination of the semiconductor. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodology can be stored in a computer-readable medium, displayed on a display device, and/or the like.

Referring now to FIG. 9, a methodology 900 that facilitates selective etching of a semiconductor by sub-bandgap-energy illumination of the semiconductor is illustrated. The methodology 900 begins at 902, and at 904 a voltage is applied between a first surface of a semiconductor and a second surface of the semiconductor. By way of example, the voltage can be applied between the first surface and the second surface by applying a voltage between electrodes that are immersed in conductive solutions that respectively make contact with the first and second surfaces of the semiconductor (e.g., the electrodes 122, 124 shown in the exemplary system 100). At 906, the semiconductor is illuminated at a first location by way of a laser that emits light that has an energy below a bandgap energy of the semiconductor. The laser is focused to a focal spot sufficiently intense to cause a hole to be generated at the first location in the semiconductor, wherein etching of the semiconductor occurs at a second location based upon the hole being generated at the first location. The methodology then ends at 908.

Figure 10:
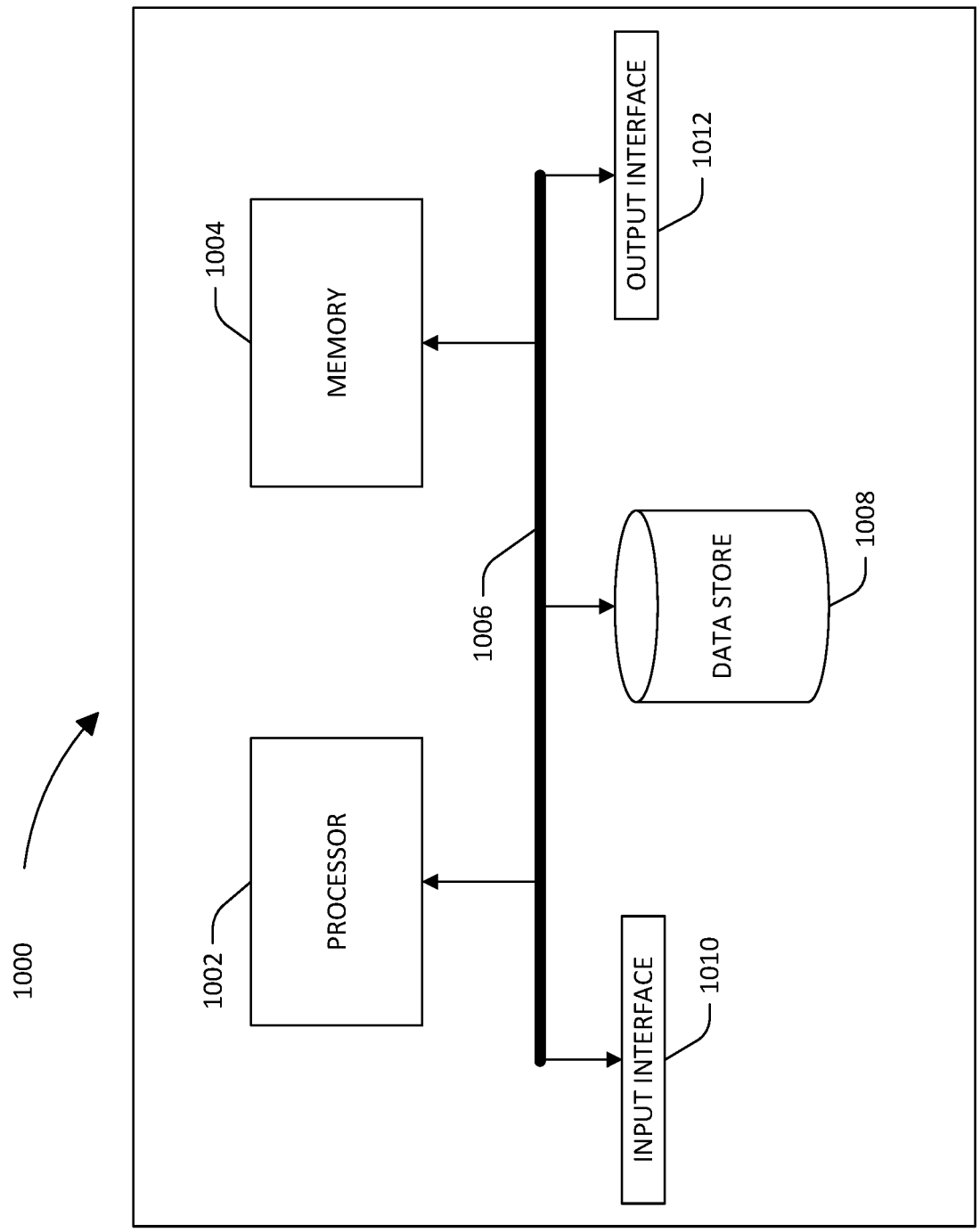
FIG. 10 is an exemplary computing system.

Referring now to FIG. 10, a high-level illustration of an exemplary computing device 1000 that can be used in accordance with the systems and methodologies disclosed herein is illustrated. For instance, the computing device 1000 may be used in a system that controls operation of a system for selective semiconductor etching (e.g., the system 100, the system 800). By way of another example, the computing device 1000 can be used in a system that performs simulations of charge-carrier migration within a semiconductor based upon a physics model. The computing device 1000 includes at least one processor 1002 that executes instructions that are stored in a memory 1004. The instructions may be, for instance, instructions for implementing functionality described as being carried out by one or more components discussed above or instructions for implementing one or more of the methods described above. The processor 1002 may access the memory 1004 by way of a system bus 1006. In addition to storing executable instructions, the memory 1004 may also store simulation results, etching definitions, states of various process parameters of a selective etching system, etc.

The computing device 1000 additionally includes a data store 1008 that is accessible by the processor 1002 by way of the system bus 1006. The data store 1008 may include executable instructions, simulation results, etc. The computing device 1000 also includes an input interface 1010 that allows external devices to communicate with the computing device 1000. For instance, the input interface 1010 may be used to receive instructions from an external computer device, from a user, etc. The computing device 1000 also includes an output interface 1012 that interfaces the computing device 1000 with one or more external devices. For example, the computing device 1000 may display text, images, etc. by way of the output interface 1012.

It is contemplated that the external devices that communicate with the computing device 1000 via the input interface 1010 and the output interface 1012 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 1000 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 1000 may be a distributed system. Thus, for instance, several devices may be in communication by way of a network connection and may collectively perform tasks described as being performed by the computing device 1000.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system comprising:
   a laser;
   an etching chamber configured to accommodate an etchant;
   a voltage source; and
   a computing device configured to perform acts comprising:
      controlling the laser to illuminate a workpiece positioned in the etching chamber, wherein the laser causes a hole to be generated in a lattice of the workpiece by way of multi-photon absorption (MPA); and
      controlling the voltage source to apply a voltage across the workpiece while the workpiece is illuminated by the laser, the voltage causes the hole to be accelerated toward or away from a surface of the workpiece, wherein an etchant in the etching chamber etches the surface of the workpiece based upon a multi-step electrochemical reaction that involves the hole that was generated in the lattice.

2. The system of claim 1, wherein the laser has a photon energy that is less than a bandgap energy of the workpiece.

3. The system of claim 1, wherein the hole is generated within a bulk of the workpiece beneath the surface of the workpiece.

4. The system of claim 1, wherein the surface is a frontside surface, wherein the laser is controlled to illuminate the workpiece from a backside of the workpiece.

5. The system of claim 1, wherein the laser causes the hole to be generated by way of MPA at a focal spot of the laser, wherein further a fluence of a beam emitted by the laser is sufficiently low in a region distal from the focal spot that MPA is unlikely to occur in the workpiece in the region.

6. The system of claim 1, the acts further comprising controlling the laser to maintain illumination of the workpiece by the laser such that additional holes are generated in the lattice of the workpiece by way of MPA, wherein the etchant continues etching the surface of the workpiece while the workpiece is illuminated by the laser.

7. The system of claim 1, the acts further comprising controlling the laser to move a focal spot of the laser while the workpiece is illuminated such that a feature that comprises a cavity is etched in the workpiece, wherein at least a portion of the cavity has no straight line path to the surface of the workpiece.

8. The system of claim 1, the acts further comprising controlling the laser to move a focal spot of the laser while the workpiece is illuminated such that a feature that follows a path of the focal spot of the laser is etched in the workpiece.

9. The system of claim 1, where controlling the voltage source comprises changing the applied voltage, wherein changing the applied voltage causes a size of a feature being etched in the surface of the workpiece to change.

10. A method comprising:
    illuminating a workpiece by way of a laser such that the laser stimulates multi-photon absorption (MPA) in the workpiece, thereby causing a hole to be created in the workpiece, wherein the hole migrates to a location at a surface of the workpiece;
    applying a voltage across the workpiece while the workpiece is illuminated, the voltage causing acceleration of the hole toward or away from the location at the surface; and
    exposing the surface of the workpiece to an etchant, wherein the etchant etches a portion of the surface at the location based upon a multi-step electrochemical reaction that involves the hole that migrated to the location.

11. The method of claim 10, further comprising changing the applied voltage, wherein changing the applied voltage causes a size of a feature being etched in the surface of the workpiece to change.

12. The method of claim 10, wherein the multi-step electrochemical reaction comprises an oxidation step and an etching step.

13. The method of claim 10, wherein the multi-step electrochemical reaction is limited by the presence of the hole at the location.

14. The method of claim 10, wherein the etchant comprises hydrofluoric acid, and wherein the multi-step electrochemical reaction is characterized by the chemical equations:

$$Si + 2F^- + 2h^+ \rightarrow SiF_2; \text{ and} \tag{a}$$

$$SiF_2 + 2HF \rightarrow SiF_4 + H_2. \tag{b}$$

15. The method of claim 10, wherein the laser has a photon energy that is less than a bandgap energy of the workpiece.

16. A system comprising:
    a semiconductor workpiece;
    an etching chamber configured to accommodate the semiconductor workpiece;
    an etchant disposed in the etching chamber;
    a laser configured to selectively illuminate the semiconductor workpiece disposed in the etching chamber;
    a voltage source that is configured to apply a voltage across the semiconductor workpiece; and
    a control system that is configured to perform acts comprising:
       controlling the laser to illuminate the semiconductor workpiece, the laser having a photon energy that is below a bandgap energy of the semiconductor workpiece, wherein the laser causes a hole to be generated in a lattice of the semiconductor workpiece by way of multi-photon absorption (MPA), wherein application of the voltage across the semiconductor workpiece causes the hole to be accelerated toward or away from a surface of the semiconductor workpiece, and further wherein the etchant etches the surface of the semiconductor workpiece based upon a multi-step reaction involving the hole that was generated in the lattice.

17. The system of claim 16, the etchant included in an etchant solution, the etchant solution comprising a surfactant.

18. The system of claim 16, wherein the etchant comprises at least one of hydrofluoric acid or ammonium fluoride.

19. The system of claim 16, wherein the semiconductor workpiece comprises at least one of an intrinsic elemental semiconductor, a group III-V semiconductor, a group III-nitride, a group II-VI semiconductor, silicon carbide, or silicon germanium.

20. The system of claim 16, wherein the multi-step reaction is limited by the presence of holes generated by the laser.

* * * * *